US012777943B2

(12) United States Patent
Abdulhadi

(10) Patent No.: US 12,777,943 B2
(45) Date of Patent: Oct. 27, 2026

(54) MULTI CHIP FRONT END MODULE WITH SHIELDING VIAS

(71) Applicant: Skyworks Solutions, Inc., Irvine, CA (US)

(72) Inventor: Abdulhadi Ebrahim Abdulhadi, Kanata (CA)

(73) Assignee: Skyworks Solutions, Inc., Irvine, CA (US)

( * ) Notice: Subject to any disclaimer, the term of this patent is extended or adjusted under 35 U.S.C. 154(b) by 609 days.

(21) Appl. No.: 18/133,248

(22) Filed: Apr. 11, 2023

(65) Prior Publication Data

US 2023/0378103 A1 Nov. 23, 2023

Related U.S. Application Data

(60) Provisional application No. 63/331,662, filed on Apr. 15, 2022.

(51) Int. Cl.

| | |
|---|---|
| ***H10W 44/20*** | (2026.01) |
| ***H10W 42/20*** | (2026.01) |
| ***H10W 70/63*** | (2026.01) |
| ***H10W 74/10*** | (2026.01) |
| *H10W 74/00* | (2026.01) |
| *H10W 90/00* | (2026.01) |

(52) U.S. Cl.

CPC ........... *H10W 44/20* (2026.01); *H10W 42/20* (2026.01); *H10W 70/635* (2026.01); *H10W 74/114* (2026.01); *H10W 44/206* (2026.01); *H10W 44/209* (2026.01); *H10W 44/241* (2026.01); *H10W 44/243* (2026.01); *H10W 74/00* (2026.01); *H10W 90/754* (2026.01)

(58) Field of Classification Search

None

See application file for complete search history.

(56) References Cited

U.S. PATENT DOCUMENTS

| | | | | |
|---|---|---|---|---|
| 5,151,770 | A * | 9/1992 | Inoue .................... | H10W 42/20 257/E23.114 |
| 5,256,590 | A * | 10/1993 | Inoue .................... | H10W 42/20 257/E23.114 |
| 6,377,464 | B1 | 4/2002 | Hashemi et al. | |
| 6,770,955 | B1 | 8/2004 | Coccioli et al. | |
| 6,804,103 | B1 | 10/2004 | Murakami et al. | |
| 6,885,561 | B1 | 4/2005 | Hashemi et al. | |
| 7,345,362 | B2 | 3/2008 | Murakami et al. | |
| 7,498,656 | B2 | 3/2009 | Zhang et al. | |
| 8,948,712 | B2 | 2/2015 | Chen et al. | |
| 9,041,472 | B2 | 5/2015 | Chen et al. | |

(Continued)

*Primary Examiner* — Cory W Eskridge

(74) *Attorney, Agent, or Firm* — VIA LLP

(57) ABSTRACT

A radio frequency front end module is provided which includes a first filter module disposed on a substrate, a second filter module disposed on the substrate, a resin casing disposed on the substrate and encapsulating the first and second filter modules, and a radio frequency shield disposed between the first and second filter module, wherein the shield comprises a plurality of vias formed in the resin casing and extending perpendicular to the substrate of the front end module, a method of reducing coupling between two filters on a multi-chip front end module having a resin encapsulation is also provided which includes disposing a plurality of vias in the resin encapsulation between the two filters.

20 Claims, 7 Drawing Sheets

(56) References Cited

U.S. PATENT DOCUMENTS

| | | | | |
|---|---|---|---|---|
| 9,203,529 | B2 | 12/2015 | Chen et al. | |
| 9,520,835 | B2 | 12/2016 | Ko et al. | |
| 9,660,584 | B2 | 5/2017 | Modi et al. | |
| 9,692,357 | B2 | 6/2017 | Hoang et al. | |
| 9,729,177 | B2 | 8/2017 | Poulin | |
| 9,755,592 | B2 | 9/2017 | Zampardi et al. | |
| 9,847,755 | B2 | 12/2017 | Sun et al. | |
| 9,871,599 | B2 | 1/2018 | Chen et al. | |
| 9,887,668 | B2 | 2/2018 | Zampardi et al. | |
| 10,090,812 | B2 | 10/2018 | Modi et al. | |
| 10,134,682 | B2 * | 11/2018 | Kumbhat | H10W 42/20 |
| 10,211,862 | B2 | 2/2019 | Poulin | |
| 10,771,024 | B2 | 9/2020 | Zampardi et al. | |
| 10,847,480 | B2 * | 11/2020 | Tsai | H01L 25/16 |
| 10,923,435 | B2 * | 2/2021 | Tsai | H10W 20/43 |
| 11,451,199 | B2 | 9/2022 | Ripley et al. | |
| 2012/0025356 | A1 * | 2/2012 | Liao | H10W 42/20<br>257/659 |
| 2012/0280366 | A1 * | 11/2012 | Kamgaing | H01L 23/552<br>257/E23.114 |
| 2018/0092257 | A1 * | 3/2018 | Otsubo | H05K 1/0218 |
| 2019/0260403 | A1 | 8/2019 | Poulin | |
| 2021/0143542 | A1 | 5/2021 | Nguyen et al. | |
| 2022/0393653 | A1 | 12/2022 | Zampardi et al. | |
| 2023/0245978 | A1 | 8/2023 | Nangalia et al. | |
| 2023/0245979 | A1 | 8/2023 | Nangalia et al. | |
| 2023/0245985 | A1 | 8/2023 | Nangalia et al. | |
| 2023/0378103 | A1 | 11/2023 | Abdulhadi | |

* cited by examiner

MULTI CHIP FRONT END MODULE WITH SHIELDING VIAS

INCORPORATION BY REFERENCE TO ANY PRIORITY APPLICATIONS

Any and all applications, if any, for which a foreign or domestic priority claim is identified in the Application Data Sheet of the present application are hereby incorporated by reference under 37 CFR 1.57.

BACKGROUND

Field

Embodiments of the invention relate to multi-chip front end modules with vias for radiation shielding, in particular with vias which prevent radiation from one filter from reaching another filter on the front end module.

Description of the Related Technology

In MCM front end modules multiple filters are located on the same module. This means that there can be problems with cross isolation between the filters, where radiation from one filter reaches and interferes with the signal on another filter. In essence, a certain amount of the filtered signal from, e.g., filter one, reaches, e.g. filter two. This can be at an amplitude or strength which causes the signal in filter two to become distorted.

By reducing the strength of any signal which reaches filter two from filter one, or vice versa, there is less distortion and interference. This allows for more efficient and robust communication using the MCM front end module.

Known methods of achieving this cross isolation use a shield formed from wires displaced in the MCM between the filters. These wires are similar to wires which are used to connect components of the MCM to a substrate, and are used simply because the technology to place them on the MCM already exists and is in use in general manufacture of the MCM.

An improved shield is described in the present application.

SUMMARY

According to one embodiment there is provided a radio frequency front end module comprising: a first filter module disposed on a substrate, a second filter module disposed on the substrate, a resin casing disposed on the substrate and encapsulating the first and second filter modules and a shield disposed between the first and second filter module, wherein the shield comprises a plurality of vias formed in the resin casing and extending perpendicular to the substrate of the front end module.

Cross isolation between filters on a multi-chip front end module (MCM) is important, otherwise signals passed by one filter on the MCM can radiate and interfere with signals passed by another filter on the MCM. By providing a plurality of vias disposed between two filters on a front end module, radiation from each filter is prevented from interfering with the other filter in the MCM. A resin casing applied to the front end module can locate the vias on the substrate of the MCM without having to support the vias on the MCM itself, and can additionally prevent damage to the module and ensure that short circuits between components cannot develop.

In one example the vias are formed as empty spaces within the resin. Alternatively the vias are formed from a conductive material. Conductive material can be used to form the shield, and can absorb the radiation emitted by one of the filters on the MCM, and improve the cross isolation between the filters.

In one example the conductive material is one of copper or gold, which are both highly electrically conductive.

In one example the first filter module and the second filter module are disposed on a substrate of the front end module. The substrate allows for resilient placing of the components within the front end module and whilst being encapsulated in resin.

In one example the substrate has a plurality of metal traces. Metal traces allow for signals to be passed along the substrate from a port to a component.

In one example the first and second filter modules are connected to one or more of the metal traces via metal wires. Wires can be used to connect the filters to the substrate in a robust fashion, without relying on contact soldering underneath the filter, which can damage the components of the filter.

In one example the first filter module and the second filter module are arranged parallel to each other on the substrate. In one example shield is disposed parallel to the first and second filters. This arrangement perfectly bisects the MCM with the filters on either side of the shield, thus the shield actively separates the filters from one another.

In one example the shield is formed from a single row of vias parallel to the first and second filters. In another example the shield if formed from two rows of perpendicular vias parallel to the first and second filters. The placement of the filters can be modified to suit the particular frequency or wavelength of the signals to be passed by the MCM.

In one example the first row of vias is offset from the second row of vias in a plane perpendicular to the shield by a distance equal to half of the distance between each of the vias of a particular row. This allows for greater shielding, as it ensures waves which pass through one row of the shield meet vias in the second row of the shield.

In one example the distance between each via in a particular row is equal to approximately 200 to 300 microns. This particular spacing is advantageous as it ensures the highest amount of cross isolation between the filters.

In one example the first filter module and the second filter module have a respective first and second end, wherein a radio frequency signal passed by the first filter module and the second filter module is configured to pass from the first end to the second end. In one example the front end module further includes a plurality of ports for connection to an external circuit. The front end module is designed to be incorporated into still other components in a circuit or device. By providing connection points this is enabled.

In one example the first and second ends of the first filter form first and second ports of the front end module. In one example the first and second ends of the second filter form third and fourth ports of the front end module. The ports of the module are formed from the inputs and outputs of the filters, as these are the components with which it is advantageous to connect to filter signals in the device.

In one example the vias are arranged to interact with waves radiated from the first filter module and the second filter module. In one example interaction comprises reflecting or refracting radiation from the one of the first or second filter modules away from the other of the first or second modules. By reflecting or refracting radiation emitted from one filter towards the other, the radiation is prevented from reaching the other filter. Reflection causes the waves to bounce back towards the filter from which they emanated, and refraction causes the waves to essentially scatter, thus avoiding the other filter.

In one example the first and second filter modules each comprise a digital step attenuator and an amplifier. A DSA and attenuator effectively filter 5G signals In one example the front end module is configured to pass waves of less than 6 GHz. This is the frequency band of the majority of low frequency 5G radio waves.

In one example the front end module is a multi chip module. By providing multiple chips on one module the number of components used is reduced and the ease of connectivity is increased.

In one example the front end module further includes a second shield disposed on the perimeter of the front end module. In one example the second shield completely surrounds the first and second filter modules. In one example the second shield is configured to interact with waves radiated from the first filter module and the second filter module. It may be advantageous to prevent radio waves from reaching other elements of the external circuitry or device. This can be achieved by providing further shields which can be targeted to the filter, or to the known location of another circuit. Furthermore, it can be advantageous to completely restrict radiation from emanating from the front end module, and this can achieved by completely enclosing the filters in a shield, such as the shields described above.

According to another embodiment there is provided an electronic communication device comprising the front end module as described in any of the embodiments above. The front end module as described above is advantageous in the filtering and reception of communication signals, particularly those known as 5G communication signals According to another embodiment there is provided a method of reducing coupling between two filters on a multi-chip front end module having a resin encapsulation comprising disposing a plurality of vias in the resin encapsulation between the two filters.

According to another embodiment there is provided a method of manufacturing a radio frequency front end module comprising: disposing a plurality of components on a substrate, the components comprising at least two filters, disposing a mold over the plurality of components, wherein the mold includes a number of protrusions arranged to protrude between the two filters, encapsulating the plurality of components in a resin bounded by the mold, demolding the substrate and resin.

According to another embodiment there is provided a method of manufacturing a radio frequency front end module comprising: disposing a plurality of components on a substrate, the components comprising at least two filters, disposing a frame of adhesive around the perimeter of the substrate, disposing a plurality of cylindrical formers between the at least two filters, encapsulating the plurality of components in a resin bounded by the frame of adhesive, demolding the cylindrical formers from the resin.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to multi chip modules, particularly front end modules. In the following description, the term multi chip module (MCM) and front end module may be used interchangeably.

Figure 1:
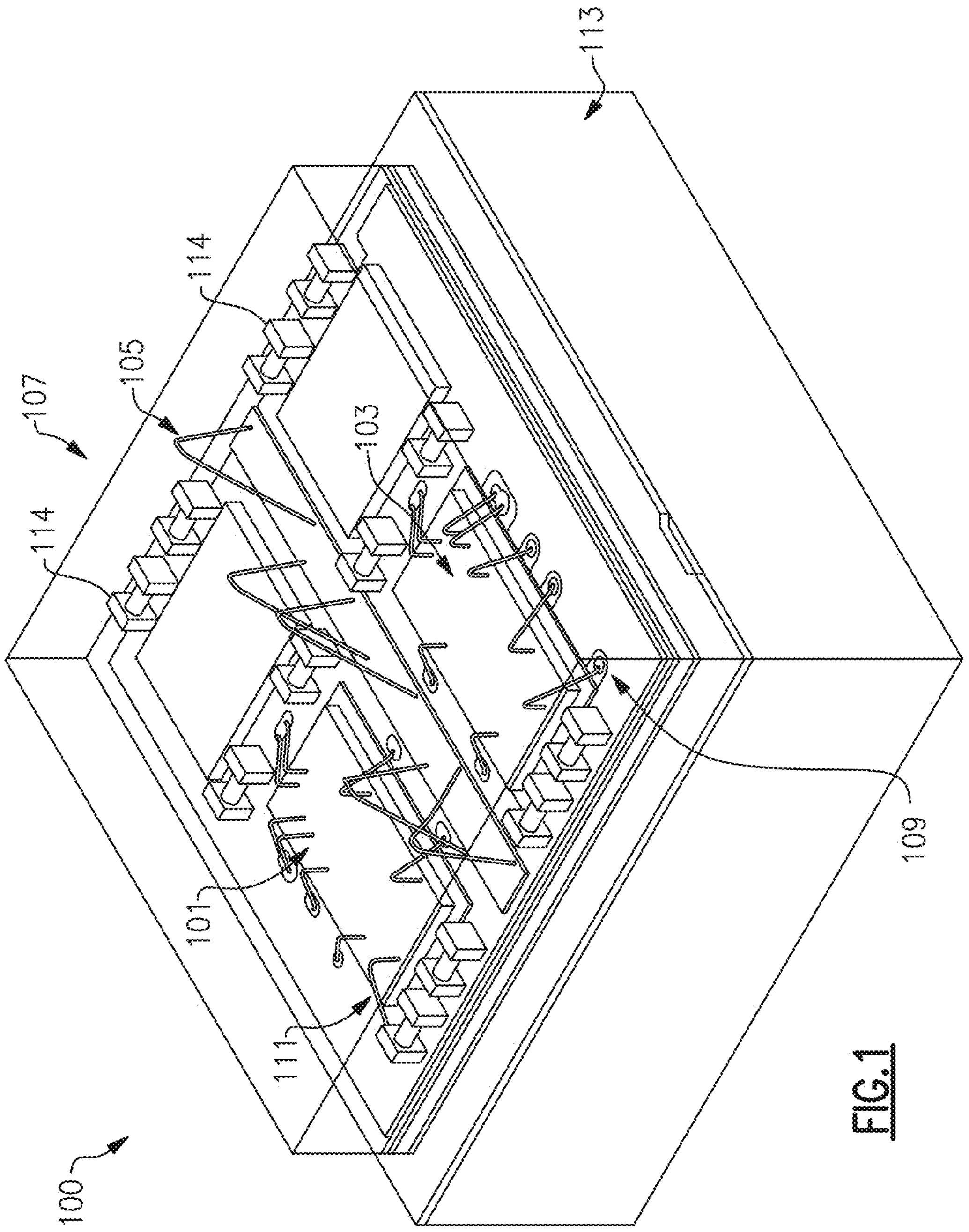
FIG. 1 shows a prior art front end module

FIG. 1 shows a prior art MCM 100 which comprises a first filter 101 and a second filter 103. The filters 101, 103 are disposed on a substrate 109 with a shield 105 between them. The MCM 100 is then encased in a resin 107 such as epoxy or polyurethane. The shield 105 provides an amount of isolation between the two filters 101, 103. The MCM 100 is shown disposed on an evaluation board 113, which is used to test the function of the MCM. The substrate 109 comprises a number of metallic traces which are used to provide conductive paths between components of the MCM, such as the components 114.

The shield 105 comprises a plurality of metal wires. It will be noted that the form of these wires is similar to the wires 111 which connect the filter components to the substrate 109. In this prior art MCM 100 the same apparatus which forms and places wires to connect components to the substrate 109 is used to place a number of similar wires between the filters 101, 103 to form the shield 105. Thus the shield 105 is implemented using components already in use on the MCM 100, and not using a dedicated shield mechanism.

Figure 2:
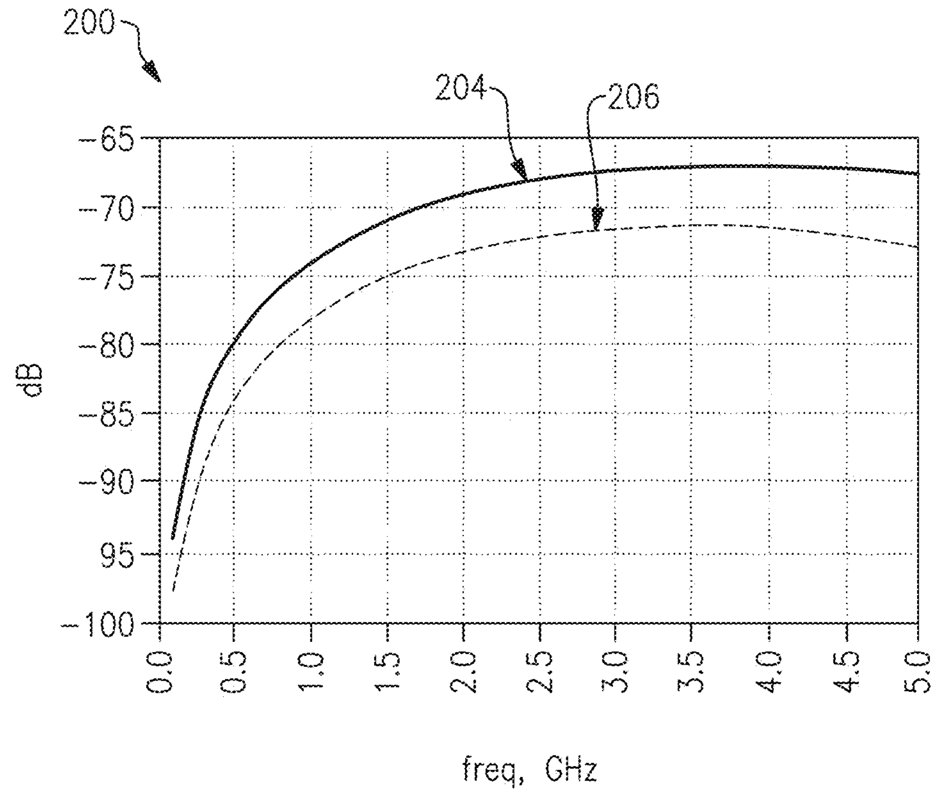
FIG. 2 shows a representative cross isolation of the prior art front end module.

The shield 105, however, does provide an amount of cross isolation. As can be seen in FIG. 2, which shows a graph 200 plotting the isolation between the two filters as a function of dB over frequency. The line 204 shows the cross isolation of an MCM with no shield, whereas the line 206 shows the cross isolation of the MCM 100. It can be seen that cross isolation is reduced in the MCM 100, as the dB figure indicated at every frequency is lower than that of the unshielded MCM.

Figure 3:
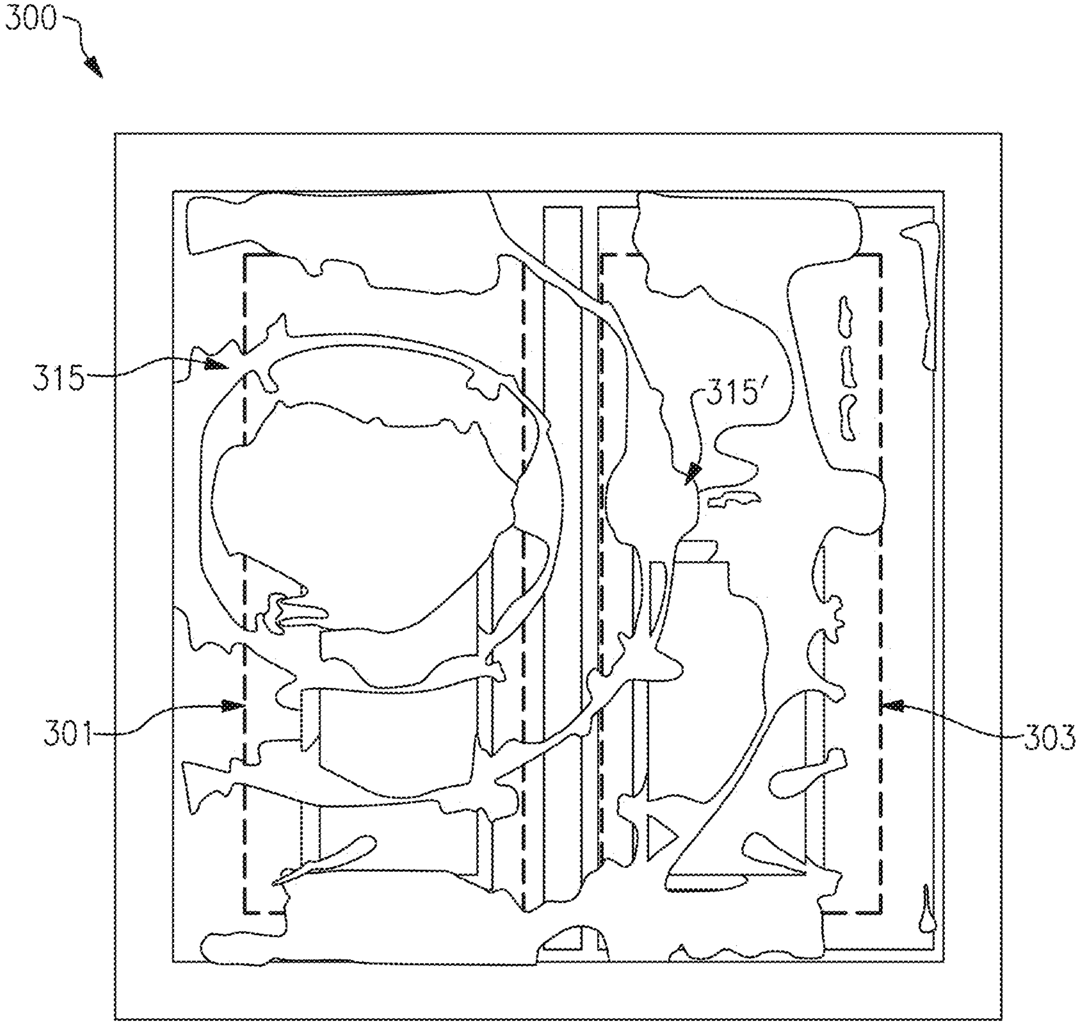
FIG. 3 shows a representative signal radiation pattern of the prior art front end module.

FIG. 3 shows a front end module 300 with overlaid radiation pattern of signals 315, 315' filtered by the first filter 301 and emanating therefrom towards the second filter 303. It can be seen that without shielding, the signals clearly interfere with the second filter 303. It is noted that in this example there is no shielding, however it can be seen how the waves interact with components of the MCM 300, and how a shield can interact with the waves to disperse or reflect them. The pattern shows essentially the peaks of a radio frequency signal which is propagated by the first filter 301. As these spread out they reduce in intensity, which is shown by thinner rings further out from the filter 301. However, they are still of sufficient intensity where they intersect with the second filter 303. The figure shown is derived by modelling the MCM with a computer, but is comparable to a real life application.

Figure 4:
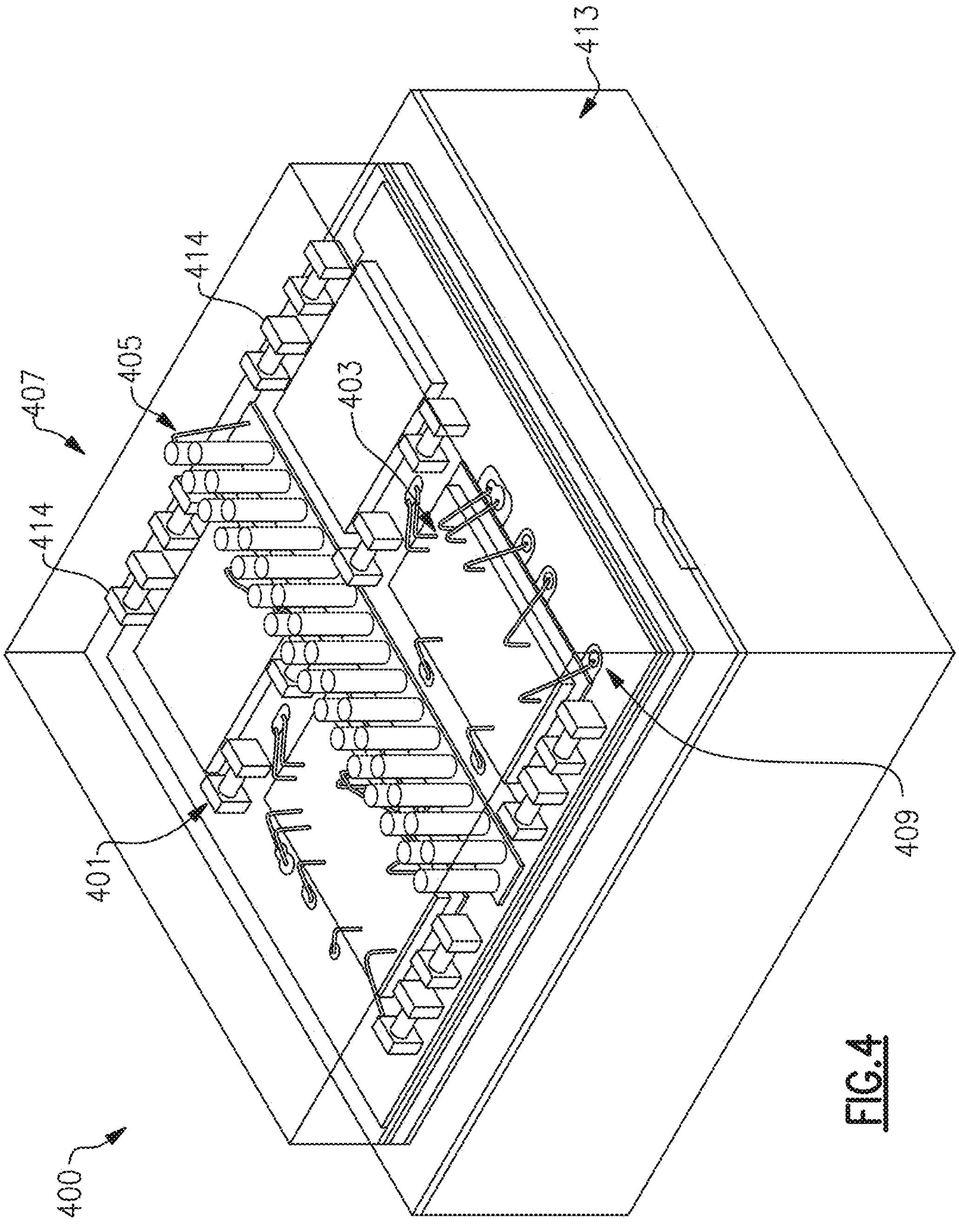
FIG. 4 shows a front end module having a shield according to an embodiment of the present invention.

FIG. 4 shows a front end module 400 having a shield formed from a plurality of vias 405. The vias 405 are formed in the resin 407 encapsulation of the MCM 400. The manner in which these are formed is set out below.

The vias 405 represent a specially designed element of the MCM 400 which provides a shield which far exceeds the performance of the prior art MCM shield 105. The vias 405 are formed between the filter modules 401 and 403, to prevent signals from interfering between the filter modules, and disposed on the substrate 411. The substrate in turn is disposed on the evaluation board 411 shown for illustrative purposes only. Other components 414, such as resistors and capacitors, of the MCM are also shown for illustrative purposes only.

The vias are arranged in a particular pattern to optimize the cross isolation reduction effect of the shield. Depending on the wavelength of the signals configured to be passed by the first filter module and second filter module this pattern may change.

For example, it may be that the signal has a relatively large wavelength. This would therefore require at least two layers of vias, as shown in FIG. 4. In this example, to maximise interference with the signals, the rows of vias are offset from each one another by half the distance between two adjacent vias in the row. This means that there is a via from one row disposed between each gap between adjacent vias of the second row.

For larger wavelength signals it may be necessary to implement further rows of vias in the shield. However, for shorter wavelength signals it may be only be necessary to have one row of vias in the shield. Furthermore, the frequency of the wave may also play a part in determining the pattern of vias. For instance, a higher frequency signal is more likely to propagate from one of the filters, and so this may require that the vias are arranged in a plurality of rows.

The vias 405 have a diameter of less than ⅕ of the wavelength of the wavelength configured. to be passed by the first or second filter module, which in the particular example is from 100 to 150 microns. The height of the vias can also be modified so that only the appropriate amount of material is required. The waves which radiate from the first filter module may have an amplitude both parallel and perpendicular to the substrate 409. The vias 405 may therefore need to be a certain height to interfere with the wave over the entire amplitude. The height of the resin encapsulation is set to at least this height, so the vias extend to the top surface of the resin, which is approximately 650 microns.

The space between the vias 405 can be tuned to the wavelength or frequency of the signals passed by the MCM. The vias can be spaced apart by less than twice the diameter of the vias, or between 200 and 300 microns.

As well as vias disposed between the filters, vias may be disposed around the perimeter of the substrate 409 to prevent radiation from interfering with components external to the MCM 400.

The vias 405 are formed in the resin encapsulation 407 of the MCM 400. This means that the vias 405 can be empty areas within the resin, i.e. devoid of any resin. The vias 405 can also be filled with a conductive material to increase the performance of the shield. Because the vias 405 can be formed after the components are placed on the substrate and therefore do not have to contact the substrate. This can help reduce any interference between the vias 405 and the filters 401, 403 which could cause unreliable operation of the filters 401, 403.

The conductive material of the vias can be any one of copper or gold, or other conductive metals. Copper and gold are beneficial as they have good electrical conductance.

The MCM 400 may be formed using chip encapsulation. Once the components of the MCM 400, such as the filters 401 and 403, and any other components such as capacitors and resistors, are disposed on the substrate, a set of connecting wires can be applied. Where it is possible to surface solder or wave solder components, such as is possible with resistors, this is carried out. Connecting wires can then be applied for instance where a connection is disposed on the top of a component and needs to be routed to the traces on the substrate 409.

With the components attached and connected, a frame is built around the exterior of the top surface of the substrate 409. Molds for the vias 405, or in the case of metal vias, the vias 405 themselves, are then disposed where necessary on the substrate. The frame is constructed from a thick adhesive, such as epoxy resin. Once the frame is formed, the remaining area is coated in a free flowing resin which is contained by the frame. Once this is set the via molds are removed and the chip is encapsulated.

Alternatively, the substrate with components attached may be located in a mold and the mold flooded with free flowing resin, thus removing the need for the framing step.

Figure 5:
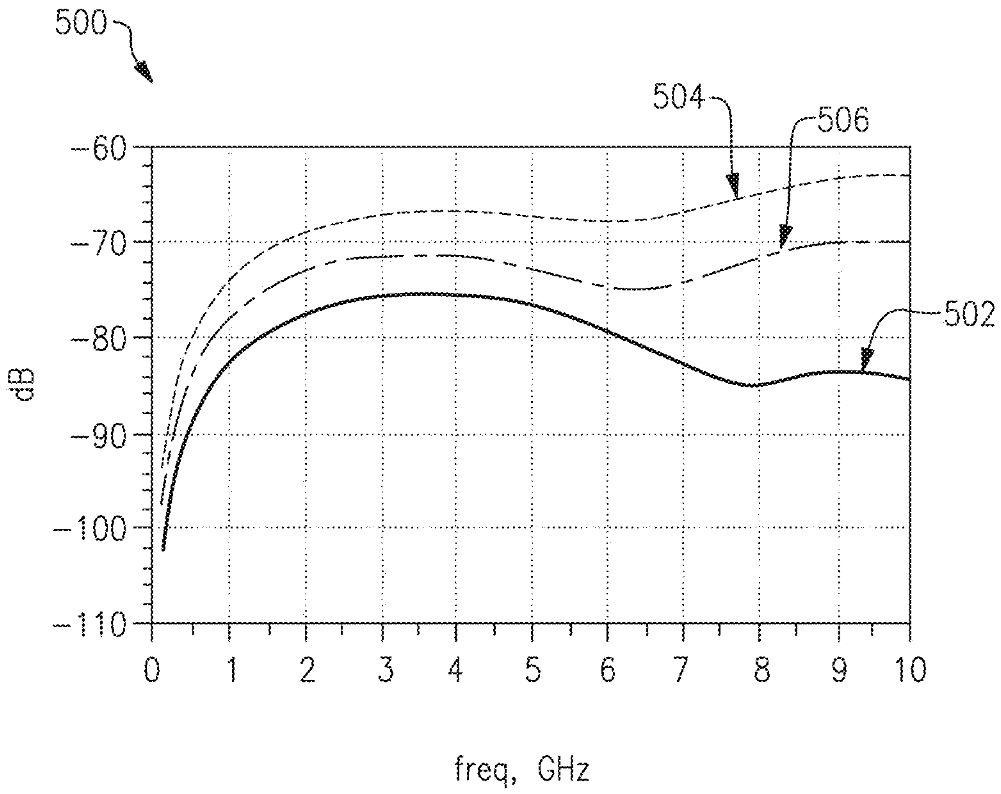
FIG. 5 shows a representative cross isolation of the front end module according to an embodiment of the present invention.

FIG. 5 is a representative graph 500 which shows the cross isolation compared between a prior art MCM with wire shields such as MCM 100, an unshielded MCM and the MCM 400 according to an embodiment of the present invention.

It can be seen that, as in FIG. 2, the prior art MCM 100 plot 506 shows an improved cross isolation over the unshielded plot 504, however the MCM 400 according to an embodiment of the present invention plot 502 shows an even further improved cross isolation with a reduction to approximately −76 dB at 4 GHz.

Figure 6:
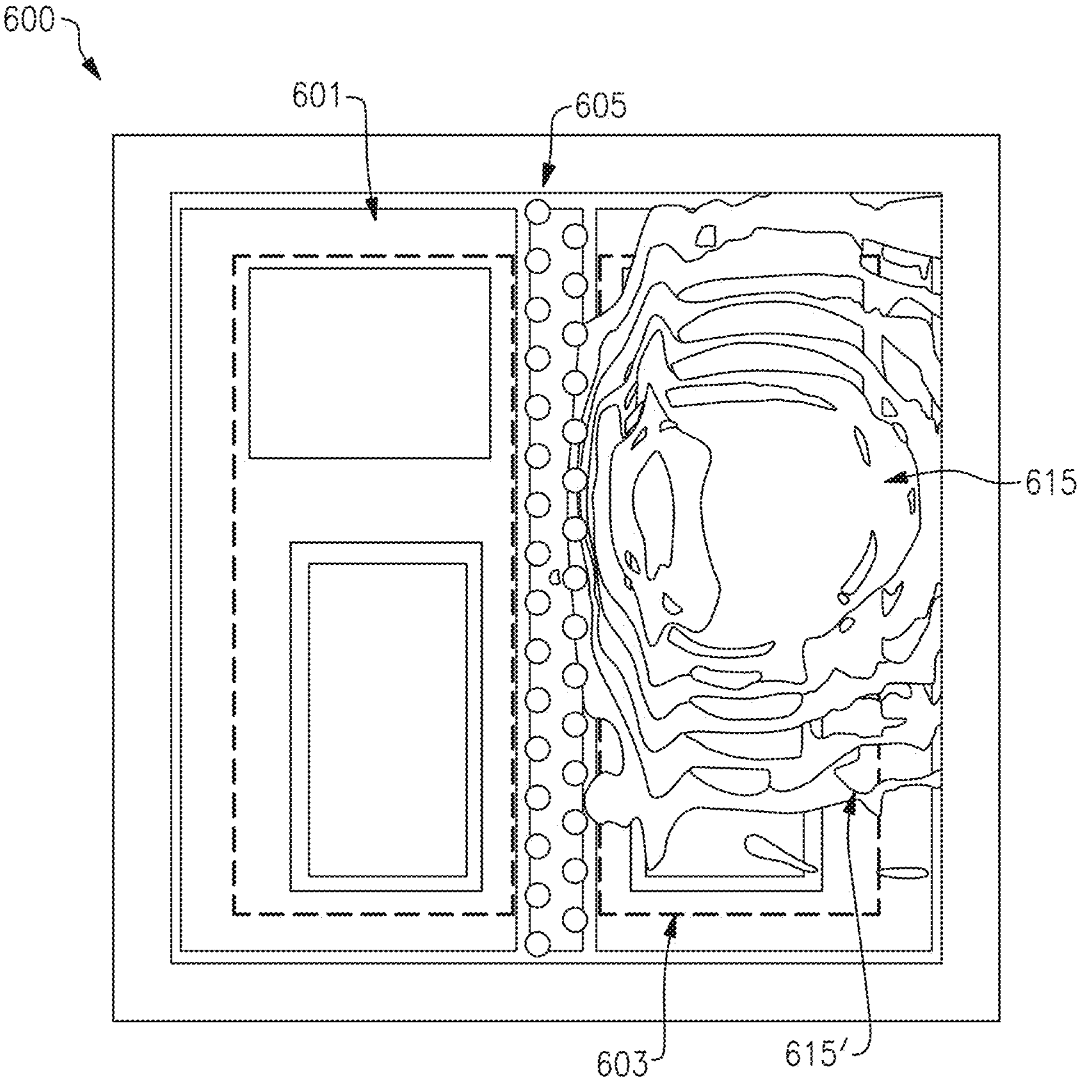
FIG. 6 shows a representative signal radiation pattern of the front end module according to an embodiment of the present invention.

FIG. 6 shows a radiation pattern of the MCM 400 which contrasts with that of FIG. 2. In FIG. 6 the radiation pattern is shown emanating from the second filter 603, to show that radiation can emanate from either filter. The radiation pattern 600 clearly shows how the vias 605 interact with the waves 615, 615' to prevent them from impinging on the first filter module 601. The pattern of radiation 615, 615' may be different from that shown, in that the waves 615, 615' may be refracted or dispersed as well as reflected or contained, as shown. Furthermore, the shield 605 may allow a certain amount of wave radiation past, but still reduce the overall effect this has on the first filter 601.

It must also be noted that the representative example 600 shows only radiation emanating from the second filter 601 to the first filter 601. In both the example and the one shown in FIG. 3 the other filter, i.e the second filter 303 and the first filter 601 also radiate filtered signals toward the first filter 301 and the second filter 603. These other signals have not been shown in FIG. 3 and FIG. 6 for ease of comprehension.

Figure 7B:
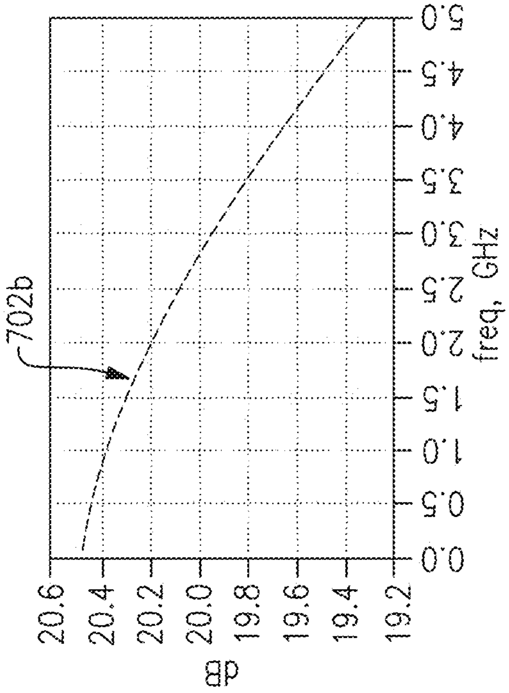
FIG. 7*b* shows a representative insertion loss of the front end module according to an embodiment of the present invention.
Figure 7A:
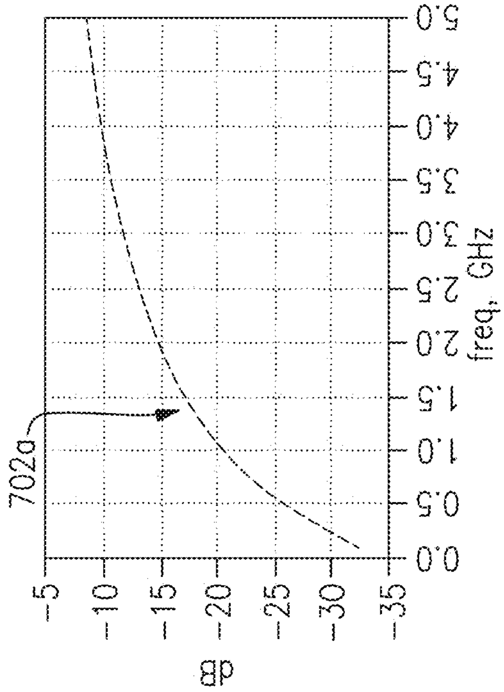
FIG. 7*a* shows a representative reflection coefficient of the front end module according to an embodiment of the present invention.

FIG. 7*a* shows the reflection coefficient and FIG. 7*b* shows the insertion loss of both the prior art MCM and the MCM 400 according to an embodiment of the present invention. As can be seen there is no contrast between the values for the prior art MCM and the MCM 400 according to an embodiment of the present invention. That is to say, the values can be represented in each plot by the same line 708*a* and 708*b*.

The reflection coefficient 702*a* shown in FIG. 7*a* is the signal degradation caused by impedance changes within the filter. The inclusion of further elements, such as the vias 405 in the shield of the MCM 400, can cause variations in the filter impedance due to capacitive and inductive effects caused by proximity to the filter, however this does not occur using the vias 405. This is beneficial, as the unshielded filter represents the minimum reflection coefficient possible, and as the reflection coefficient of an embodiment of the present MCM 400 is the same, there is no degradation caused by the vias 405.

The insertion loss 702*b* is the signal degradation caused at the point of signal insertion due to parasitic elements of the filter. As in FIG. 7*a*, FIG. 7*b* shows that this is unchanged between the prior art unshielded filter and the MCM 400 according to an embodiment of the present invention. This means that the vias 405 have no effect on parasitic elements of the MCM 400, and cause no degradation over what is caused by the filters 401 and 403 themselves.

Whilst the examples above have been described with specific front end modules in mind, the general principle of the shield is applicable to any filter module, where it is necessary, or even desired to increase cross isolation between filters.

Further examples of the electronic devices that aspects of this disclosure may be implemented include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A radio frequency front end module comprising:

a first filter module disposed on a substrate;

a second filter module disposed on the substrate;

a resin casing disposed on the substrate and encapsulating the first and second filter modules; and a radio frequency shield disposed between the first and second filter modules, the radio frequency shield including a plurality of vias formed in the resin casing and extending perpendicular to the substrate with a portion of the resin casing separating the plurality of vias from the substrate, the plurality of vias arranged into a least a first row disposed in parallel between the first and second filter modules and a second row disposed in parallel between the first row and the first filter module, the first row of vias is offset from the second row of vias by a distance equal to half of the distance between two adjacent vias of the second row, each via having a diameter that is less than ⅕ of a wavelength passed by the first and second filter modules.

2. The front end module of claim 1 wherein the plurality of vias do not extend above a top of the resin casing.

3. The front end module of claim 1 wherein the radio frequency shield further comprises a third row parallel to the first and second rows, the third row between the second row and the first filter module.

4. The front end module of claim 2 wherein the first and second rows of vias are formed with molds in the resin casing.

5. The front end module of claim 4 wherein the plurality of vias cause no degradation in insertion loss over what is caused by the first and second filter modules.

6. The front end module of claim 4 wherein a distance between each via in a particular row is equal to 200 to 300 microns.

7. The front end module of claim 1 wherein the first filter module and the second filter module have a respective first and second end, a radio frequency signal passed by the first filter module and the second filter module configured to pass from the first end to the second end.

8. The front end module of claim 1 further comprising a plurality of ports for connection to an external circuit.

9. The front end module of claim 7 wherein the first and second ends of the first filter form first and second ports of the front end module.

10. The front end module of claim 9 wherein the first and second ends of the second filter form third and fourth ports of the front end module.

11. The front end module of claim 1 wherein the plurality of vias are arranged to interact with waves radiated from the first filter module and the second filter module.

12. The front end module of claim 11 wherein interaction includes reflecting or refracting radiation from the first filter module away from the second filter module.

13. The front end module of claim 1 further configured to pass waves of less than 6 GHz.

14. The front end module of claim 1 wherein the front end module is a multi chip module.

15. The front end module of claim 1 further including a second shield disposed on a perimeter of the front end module.

16. The front end module of claim 15 wherein the second shield completely surrounds the first and second filter modules.

17. The front end module of claim 15 wherein the second shield is configured to interact with waves radiated from the first filter module and the second filter module.

18. A radio frequency front end module comprising:

a first filter disposed on a substrate;

a second filter disposed on the substrate;

a resin casing that encapsulates the first filter and the second filter; and a radio frequency shield disposed between the first filter and the second filter, the radio frequency shield including a plurality of protrusions formed in the resin casing and extending perpendicular to the substrate with a portion of the resin casing separating the plurality of protrusions from the substrate, the plurality of protrusions arranged into a least a first row disposed in parallel between the first and second modules and a second row disposed in parallel between the first row and the first filter module, the first row of vias is offset from the second row of vias by a distance equal to half of the distance between two adjacent vias of the second row, each via having a diameter that is less than ⅕ of a wavelength passed by the first and second filter modules.

19. The radio frequency front end module of claim 18 wherein the plurality of protrusions include conductive material.

20. The radio frequency front end module of claim 18 wherein the first and second rows of protrusions are formed with molds in the resin.

* * * * *